US011249139B2

(12) United States Patent
Enmei et al.

(10) Patent No.: US 11,249,139 B2
(45) Date of Patent: Feb. 15, 2022

(54) BATTERY MONITORING SYSTEM

(71) Applicant: HITACHI AUTOMOTIVE SYSTEMS, LTD., Hitachinaka (JP)

(72) Inventors: Takuya Enmei, Hitachinaka (JP); Akihiro Machida, Hitachinaka (JP); Tatsumi Yamauchi, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 159 days.

(21) Appl. No.: 16/619,397

(22) PCT Filed: May 8, 2018

(86) PCT No.: PCT/JP2018/017697
§ 371 (c)(1),
(2) Date: Dec. 4, 2019

(87) PCT Pub. No.: WO2018/230187
PCT Pub. Date: Dec. 20, 2018

(65) Prior Publication Data
US 2020/0124677 A1   Apr. 23, 2020

(30) Foreign Application Priority Data
Jun. 14, 2017 (JP) .............................. JP2017-117182

(51) Int. Cl.
G01R 31/3835 (2019.01)
G01R 31/396 (2019.01)
(Continued)

(52) U.S. Cl.
CPC ....... *G01R 31/3835* (2019.01); *G01R 31/367* (2019.01); *G01R 31/396* (2019.01); *G01R 31/54* (2020.01); *H02J 7/0047* (2013.01)

(58) Field of Classification Search
None
See application file for complete search history.

(56) References Cited

U.S. PATENT DOCUMENTS

2005/0099161 A1*  5/2005  Sato ...................... H02J 7/0047
                                                               320/134
2008/0303528 A1* 12/2008  Kim ..................... G01R 31/385
                                                               324/430
(Continued)

FOREIGN PATENT DOCUMENTS

JP   2010-256155 A    11/2010
JP   2012-122856 A     6/2012
(Continued)

OTHER PUBLICATIONS

International Search Report, PCT/JP2018/017697, dated Aug. 21, 2018, 3 pgs.

*Primary Examiner* — Arleen M Vazquez
*Assistant Examiner* — Brandon J Becker
(74) *Attorney, Agent, or Firm* — Volpe Koenig

(57) ABSTRACT

When a battery voltage of a battery cell is high, it takes time for a detected voltage to drop to a fixed threshold. Therefore, an ON control of a switch element takes long time to detect a disconnection state reliably. A battery monitoring system includes: a monitoring circuit corresponding to an assembled battery having a plurality of battery cells and which monitors states of the battery cells; voltage detection lines which are provided corresponding to the battery cells and which connect the battery cells with the monitoring circuit; and switch elements which are provided between the voltage detection lines and which adjust voltages of the battery cells, the battery monitoring system compares battery voltages of the adjacent battery cells with a varying threshold determined based on a voltage just before checking a disconnection state and detects disconnection states of the voltage detection lines according to the comparison result.

3 Claims, 4 Drawing Sheets

(51) Int. Cl.
G01R 31/367 (2019.01)
G01R 31/54 (2020.01)
H02J 7/00 (2006.01)

(56) References Cited

U.S. PATENT DOCUMENTS

| | | | |
|---|---|---|---|
| 2009/0198399 A1* | 8/2009 | Kubo | B60L 58/22 |
| | | | 701/22 |
| 2010/0001737 A1* | 1/2010 | Kubo | H02J 7/0013 |
| | | | 324/434 |
| 2010/0271052 A1 | 10/2010 | Ishikawa et al. | |
| 2012/0146652 A1 | 6/2012 | Aoki et al. | |
| 2015/0346257 A1* | 12/2015 | Tabatowski-Bush | |
| | | | G01R 31/52 |
| | | | 324/503 |
| 2016/0103184 A1* | 4/2016 | Kawai | G01R 31/367 |
| | | | 702/63 |
| 2017/0184683 A1* | 6/2017 | Kobayashi | H01M 10/482 |
| 2017/0279161 A1* | 9/2017 | Kamikawa | H01M 50/20 |
| 2018/0294666 A1* | 10/2018 | Tian | H02J 7/008 |

FOREIGN PATENT DOCUMENTS

| | | |
|---|---|---|
| JP | 2014-102127 A | 6/2014 |
| JP | 2016-096592 A | 5/2016 |
| JP | 2016-152720 A | 8/2016 |

* cited by examiner

BATTERY MONITORING SYSTEM

TECHNICAL FIELD

The present invention relates to a battery monitoring system.

BACKGROUND ART

In order to secure a desired high voltage, in a hybrid vehicle (HEV) or an electric vehicle (EV), an assembled battery (battery system) including a plurality of battery cells being secondary batteries connected in series and parallel is used. For capacity calculation and security management of each battery cell, the above assembled battery includes a monitoring circuit for monitoring a state of the battery cell and controlling the charge and discharge, and a voltage of each battery cell is adjusted with use of the monitoring circuit.

Although a voltage detection line is provided between each battery cell and the monitoring circuit, when the voltage detection line is disconnected, a voltage of the battery cell cannot be measured accurately and the voltage of each battery cell cannot be adjusted correctly. Patent Document 1 discloses a device in which a resistor is provided between voltage detection lines connected to a positive pole and a negative pole of a battery cell, the battery cell is discharged through the resistor for a predetermined time, and a detected voltage between the voltage detection lines is compared with a fixed threshold. In this system, a switch element connected between the voltage detection lines through the resistor is ON-controlled and, when the detected voltage between the voltage detection lines is equal to or less than the fixed threshold, it is determined that disconnection has occurred.

CITATION LIST

Patent Literature

PTL1: Japanese Patent Application Laid-Open No. 2016-96592

SUMMARY OF INVENTION

Technical Problem

According to the conventional system, when the voltage of the battery cell is high, it takes time for the detected voltage to fall to the fixed threshold. Therefore, the ON control of the switch element takes long time to detect the disconnection reliably.

Solution to Problem

In a battery monitoring system according to the present invention including: a monitoring circuit which is provided corresponding to an assembled battery having a plurality of battery cells and which monitors states of the battery cells; voltage detection lines which are provided corresponding to the battery cells and which connect the battery cells with the monitoring circuit; and switch elements which are provided between the voltage detection lines and which adjust voltages of the battery cells, the battery monitoring system compares battery voltages of the adjacent battery cells with a varying threshold determined based on a voltage just before checking a disconnection state and detects disconnection states of the voltage detection lines according to the comparison result.

Advantageous Effects of the Invention

According to the present invention, even if a battery voltage is high, the time required for ON control of switch elements becomes short, and a disconnection state can be detected reliably.

DESCRIPTION OF EMBODIMENTS

Figure 1:
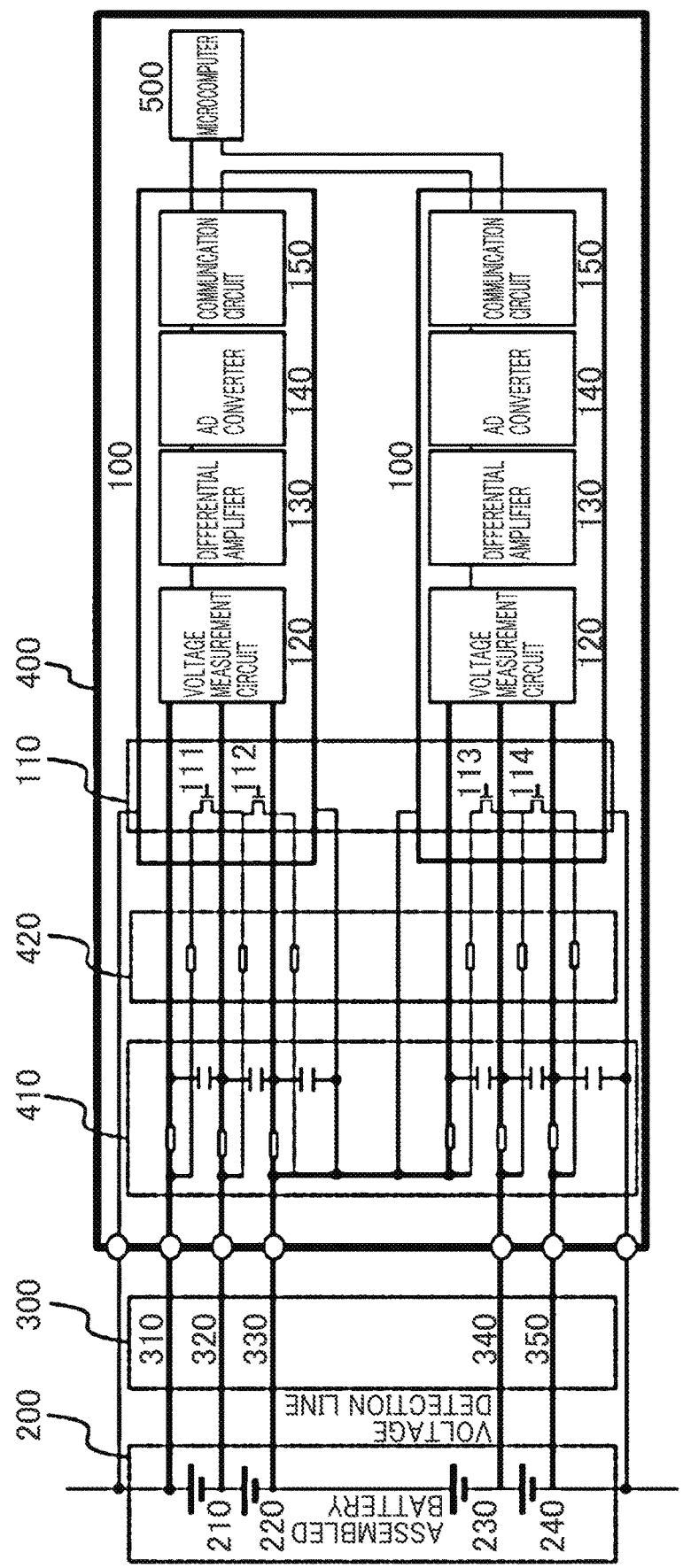
FIG. 1 is a circuit diagram of a battery monitoring system.

Hereafter, with reference to the drawings, the battery monitoring system according to one embodiment of the present invention will be explained. FIG. 1 is a circuit diagram of the battery monitoring system.

An assembled battery 200 includes a plurality of battery cells 210 to 240. The battery cells 210 to 240 are discharged by supplying electric power to a load (not shown). Moreover, the battery cells 210 to 240 are charged by the electric power supplied from a charger etc (not shown). A connection harness 300 includes voltage detection lines 310 to 350. The battery monitoring system 400 is connected with the assembled battery 200 through the connection harness 300.

Though an example of the assembled battery 200 is shown here where the battery cells 210 to 240 are connected in series, the assembled battery 200 may be configured differently. For example, the battery cells may be connected in parallel which may further be connected in series. The number of the battery cells is also not limited.

Corresponding to upper battery cells 210 to 220 and lower battery cell 230 to 240, respectively, the battery monitoring system 400 includes a filter circuit 410 for measurement, an adjusting circuit 420, and a monitoring circuit 100. A microcomputer 500 is connected to the monitoring circuit 100.

The monitoring circuit 100 is a semiconductor integrated circuit including a discharge circuit 110, a voltage measurement circuit 120, a differential amplifier 130, an AD converter 140, and a communication circuit 150, and monitors states of battery cells.

As for voltage detection lines 310 to 350, one end thereof is connected to a positive pole and a negative pole of each of the battery cells 210 to 240, respectively, and the other end thereof is connected to the voltage measurement circuit 120 through the filter circuit 410 for measurement, respectively. The voltage of each battery cell measured by the voltage measurement circuit 120 is amplified to a suitable voltage level by the differential amplifier 130, converted to a digital value by the AD converter 140, and transmitted to the microcomputer 500 by the communication circuit 150.

Being connected to the voltage detection lines 310 to 350, the filter circuit 410 for measurement constitutes a filter circuit including a resistor and a filter capacitor for measurement. The adjusting circuit 420 is a part which branches from the voltage detection lines 310 to 350 and to which resistors are connected.

The discharge circuit 110 is connected to the resistor of the adjusting circuit 420, and includes switch elements 111 to 114. Each of the switch elements 111 to 114 is disposed between the positive pole and the negative pole of each of the battery cells 210 to 240 and is subject to an ON-OFF control by the voltage measurement circuit 120. For example, when the switch element 112 is turned ON for a predetermined time by the voltage measurement circuit 120, the positive pole and the negative pole of the battery cell 220 are shorted through the adjusting circuit 420, and the battery cell 220 is discharged. At this time, an adjacent switch element, for example, the switch element 111, is not turned ON simultaneously.

Figure 2:
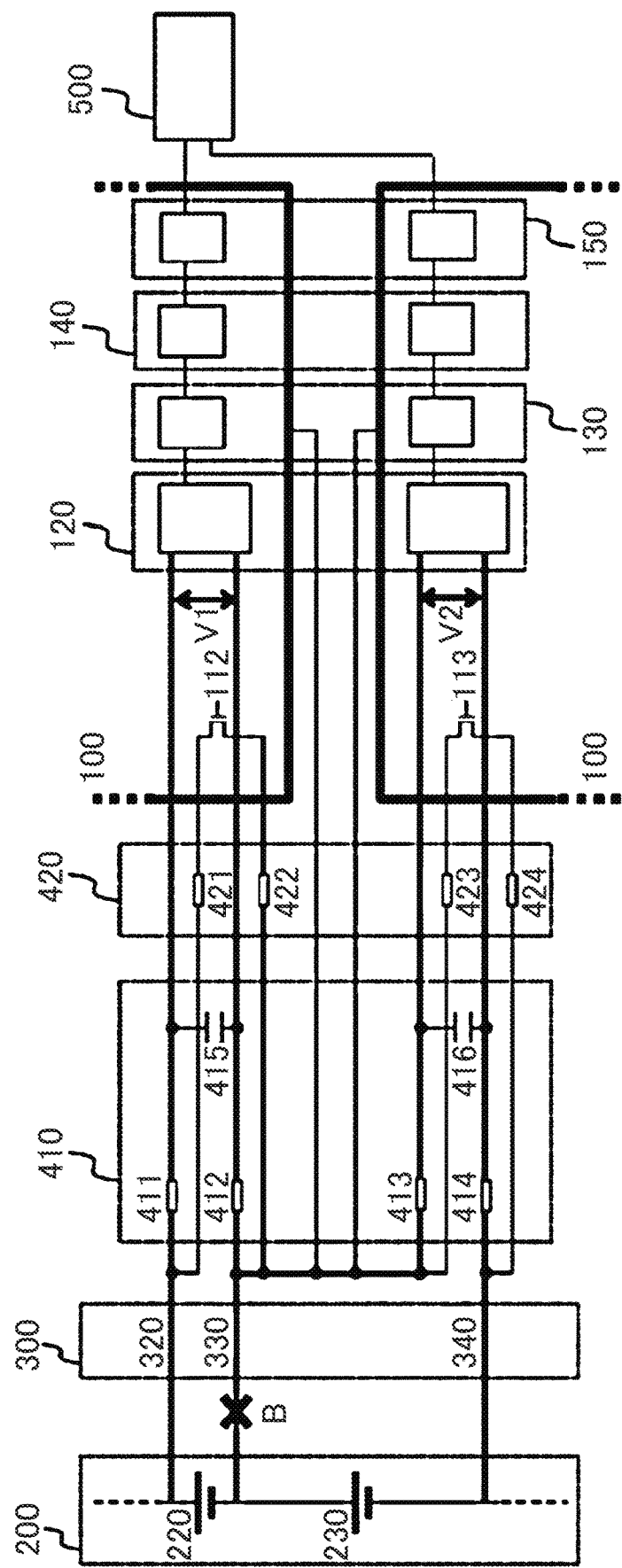
FIG. 2 is a circuit diagram of a principal part of the battery monitoring system.

FIG. 2 is a circuit diagram of a principal part of the battery monitoring system. The circuit diagram of the principal part shown in FIG. 2 includes: two battery cells 220 and 230 adjacent to each other; the connection harness 300 connected to the battery cells 220 and 230; the filter circuit 410 for measurement having filter resistors 411, 412, 413, and 414 for measurement and filter capacitors 415 and 416 for measurement; and the adjusting circuit 420 having resistors 421, 422, 423, and 424. Further, as in FIG. 1, the circuit diagram includes: switch elements 112 and 113, the voltage measurement circuit 120, the differential amplifier 130, the AD converter 140, the communication circuit 150, and the microcomputer 500.

In FIG. 2, V1 voltage is a voltage inputted from the upper battery cell 220 to the voltage measurement circuit 120 and V2 voltage is a voltage inputted from the lower battery cell 230 adjacent to the upper battery cell 220 to the voltage measurement circuit 120.

Figure 3:
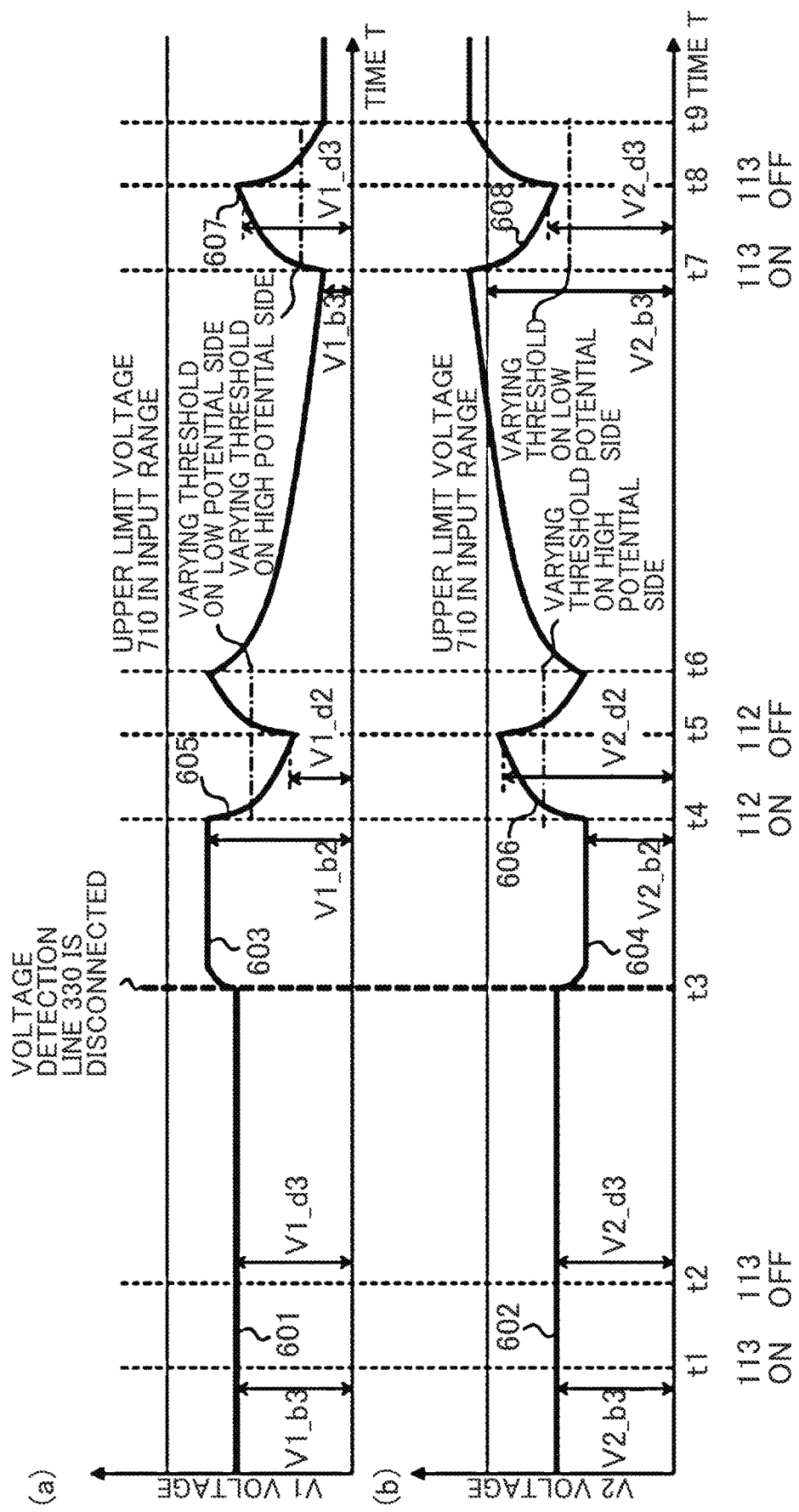
FIG. 3(a) and FIG. 3(b) are diagrams showing variation in voltage to be inputted to the voltage measurement circuit.

FIG. 3(*a*) and FIG. 3(*b*) show variation in V1 voltage and V2 voltage inputted to the voltage measurement circuit 120. FIG. 3(*a*) shows variation in V1 voltage and FIG. 3(*b*) shows variation in V2 voltage. It is an example where the voltage detection line 330 shown in FIG. 2 is disconnected at a broken point B. In addition, the disconnection referred to in the present embodiment also includes a case where the voltage detection line serves as a high resistance and comes to be in a state near disconnection.

Hereafter, with reference to FIGS. 2 and 3, the way to detect a disconnection state of the voltage detection line will be explained.

First, when the voltage detection line 330 is not disconnected, even if the switch element 113 is turned ON or OFF at time t1 and time t2 in FIG. 3(*a*) and FIG. 3(*b*), as indicated by 601 and 602 in FIG. 3(*a*) and FIG. 3(*b*), V1 voltage and V2 voltage are equivalent to voltages of the battery cells 220, 230, respectively, and there is no change in voltage.

Next, a case where the voltage detection line 330 is disconnected at the broken point B in FIG. 2 will be explained. In this case, from time t3 at which the disconnection took place, the low potential side of V1 and the high potential side of V2 will be in floating states, respectively. That is, V1 voltage and V2 voltage do not settle under the influence of variation in characteristics of parts or variation in electric-current consumption, as indicated by 603 and 604 in FIG. 3(*a*) and FIG. 3(*b*). However, in this case also, as shown in Equation (1) below, the sum of V1 voltage and V2 voltage is always equal to the sum of the voltage of the battery cell 220 and the voltage of the battery cell 230.

$$V1+V2=\text{Voltage of battery cell}220+\text{Voltage of battery cell }230 \quad (1)$$

In order to detect disconnection, at time t4, when the switch element 112 shown in FIG. 2 is turned ON, the filter capacitor 415 for measurement is discharged through the filter resistors 411 and 412 for measurement and the adjusting resistors 421 and 422. When the filter capacitor 415 for measurement is discharged, V1 voltage falls, as indicated by 605 in FIG. 3(*a*), according to a time constant calculated from an electrostatic capacity of the filter capacitor 415 for measurement and a combined resistance of the resistors 411, 412, 421, and 422. If voltage V1 falls, the voltage V2 goes up according to Equation (1) as indicated by 606 in FIG. 3(*b*).

According to the present embodiment, the disconnection state is detected by making use of a difference between V1 voltage and V2 voltage when the voltage detection line 330 is not in a disconnected state and when it is in a disconnected state. That is, when V1_d2 of V1 which is the value of V1 voltage after the switch element 112 is turned ON at time t4 becomes below the varying threshold on the low potential side or when V2_d2 which is the value of V2 voltage exceeds the varying threshold on the high potential side, it is determined that the voltage detection line 330 is in a disconnection state.

The varying threshold on the low potential side and the varying threshold on the high potential side are calculated by Equation (2) and Equation (3). A just-before voltage on the high potential side of Equation (2) is voltage V2_b2 just before time t4 shown in FIG. 3(*b*), and is a voltage just before the switch element 112 is turned ON. Also, a just-before voltage on the low potential side of Equation (3) is voltage V1_b2 just before time t4 shown in FIG. 3(*a*), and is a voltage just before the switch element 112 is turned ON. Here, α is a coefficient larger than 0 but smaller than 1 and is to set an optimal value according to the time at which the switch element 112 is turned ON and a time constant of the filter capacitor 415 for measurement.

$$\text{Varying threshold on the high potential side}=\text{just-before voltage on the high potential side}\times(1+\alpha) \quad (2)$$

$$\text{Varying threshold on the low potential side}=\text{just-before voltage on the low potential side}\times(1-\alpha) \quad (3)$$

The switch element 112 is turned OFF at time t5. However, before time t5, the value of V1 voltage being V1_d2 becomes below the varying threshold on the low potential side or the value of V2 voltage being V2_d2 exceeds the varying threshold on the high potential side. Therefore, it becomes possible to detect the disconnection state in a shorter time than the case of the detection using a conventional fixed threshold. Also, time t6 is shown as an example where the switch element 112 is turned ON for discharge control.

Next, a disconnection state of the voltage detection line 330 can be also detected by turning the switch element 113 ON. Hereafter, this case will be explained with reference to FIG. 3(*a*) and FIG. 3(*b*).

After the voltage detection line 330 becomes disconnected at time t3, with the switch element 112 turned OFF, at time t7, the switch element 113 is turned ON. As a result, the filter capacitor 416 for measurement is discharged through the filter resistors 413 and 414 for measurement and resistors 423 and 424 for adjustment. When the filter capacitor 416 for measurement is discharged, V2 voltage falls, as indicated by 608 in FIG. 3(*b*), according to a time constant calculated from an electrostatic capacity of the filter capacitor 416 for measurement and a combined resistance of the resistors 413, 414, 423, and 424. If the voltage V2 falls, the V1 voltage goes up as indicated by 607 in FIG. 3(*a*) according to Equation (1).

That is, when V1_d3 which is the value of V1 voltage after the switch element 113 is turned ON at time t7 exceeds the varying threshold on the high potential side or when V2_d3 which is the value of V2 voltage becomes below the varying threshold on the low potential side, it is determined that the line is in a disconnected state.

The varying threshold on the high potential side and the varying threshold on the low potential side are calculated based on Equation (2) and Equation (3). A just-before voltage on the high potential side in Equation (2) is a voltage V1_b3 just before time t7 shown in FIG. 3(*a*). Also, a just-before voltage on the low potential side in Equation (3) is a voltage V2_b3 just before time t7 shown in FIG. 3(*b*).

Further, a just-before voltage on the low potential side is a value of V2 voltage or a value of V1 voltage corresponding to the switch element turned ON. To be specific, when the switch element 113 is turned ON, the just-before voltage on the low potential side is the value of V2 voltage and is voltage V2_b3. When the switch element 112 is turned ON, the just-before voltage on the low potential side is the value of V1 voltage being voltage V1_b2. The just-before voltage on the high potential side is the value of V2 voltage or the value of V1 voltage corresponding to the switch element which is turned OFF.

The switch element 113 is turned OFF at time t8. However, before time t8, the value of V1 voltage being V1_d3 exceeds the varying threshold on the high potential side or the value of V2 voltage being V2_d3 becomes below the varying threshold on the low potential side. Therefore, it becomes possible to detect the disconnection state in a shorter time than the case of the detection using a conventional fixed threshold. Also, time t9 is shown as an example where the switch element 113 is turned ON for discharge control.

Further, V1 voltage and V2 voltage can be measured by the voltage measurement circuit 120 up to an upper limit voltage 710 in an input range shown in FIG. 3(*a*) and FIG. 3(*b*). The upper limit voltage 710 in the input range is determined by the combination of the AD converter 140 and the differential amplifier 130. When V1 voltage or V2 voltage higher than the upper limit voltage 710 in the input range is inputted, the monitoring circuit 100 recognizes this inputted voltage as an upper limit voltage 710 in the input range. For example, as indicated by 608 in FIG. 3(*b*), voltage V2_b3 becomes lower than actual V2 voltage, and the varying threshold on the low potential side calculated by Equation (3) may be set unsuitably low. In such a case, voltage V2_d3 shown in FIG. 3(*b*) may not become below the varying threshold on the low potential side. However, according to Equation (1), voltage V1_b3 shown in FIG. 3(*a*) is always below the upper limit voltage 710 in the input range. Therefore, the varying threshold on the high potential side is appropriately set, and a disconnection state is detected by voltage V1_d3 shown in FIG. 3(*a*) exceeding the varying threshold on the high potential side.

In this case, if the coefficient α in Equation (2) or Equation (3) is set unsuitably large, the varying threshold on the high potential side becomes higher than an upper limit voltage in the input range, and voltage V1_d3 shown in FIG. 3(*a*) cannot exceed the varying threshold on the high potential side. Therefore, so as to be able to detect a disconnection state in at least one of the cases of V1 voltage and V2 voltage, the coefficient α is set as follows, considering the upper limit voltage 710 in the input range. That is, being in a range between 0 or more and 1 or less, A satisfies at least one of Equation (4) or Equation (5). Here, the maximum value of the battery voltage to be used is a maximum value of the voltage of the battery cells 220 and 230.

$$(\text{Maximum value of the battery voltage to be used}) \times 2 \times A \leq (\text{upper limit voltage in input range}) \quad (4)$$

$$(\text{Maximum value of the battery voltage to be used}) \times 2 \times (1-A) \times (1+\alpha) \leq (\text{upper limit voltage in input range}) \quad (5)$$

Figure 4:
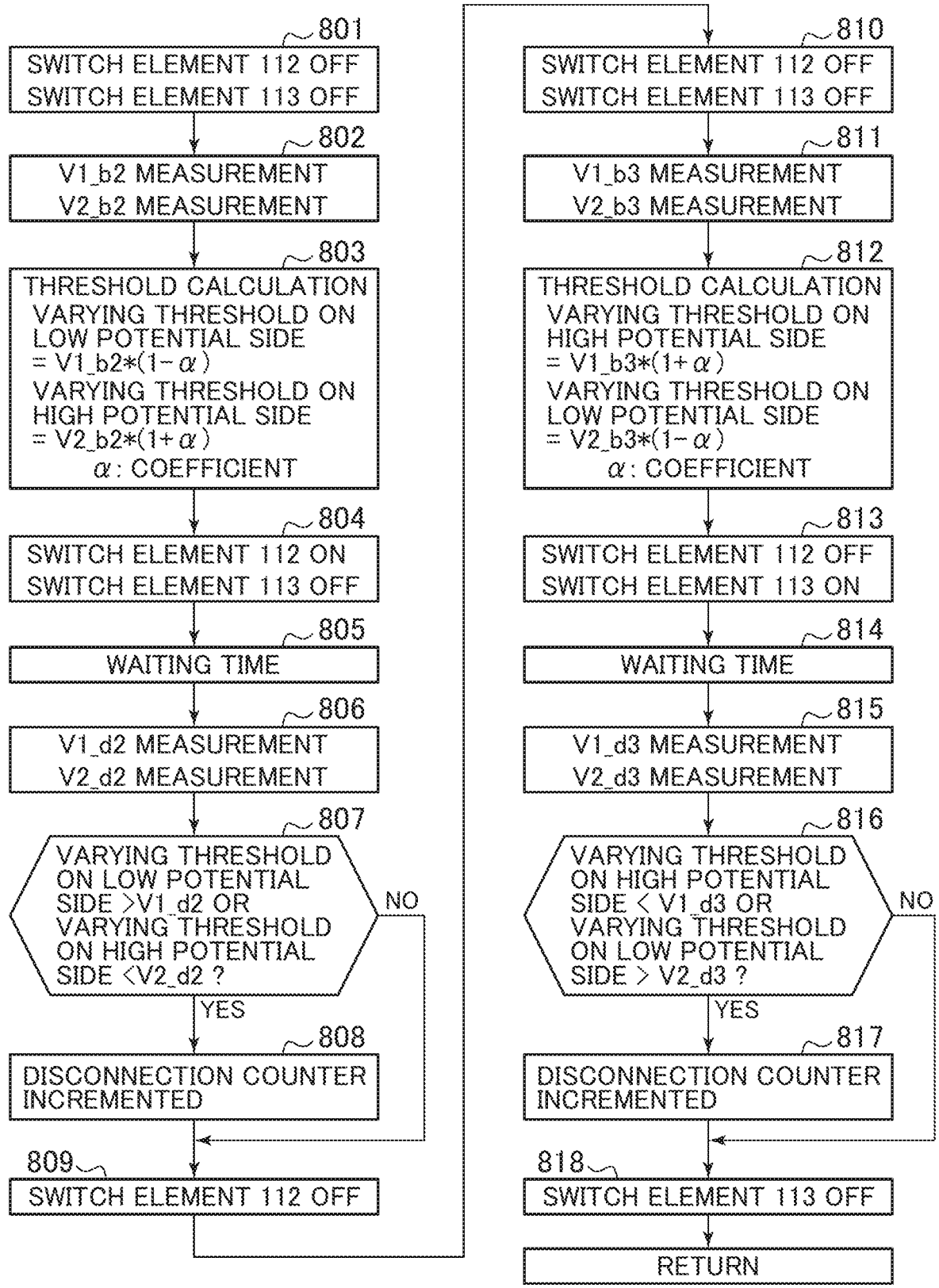
FIG. 4 is a flowchart of the battery monitoring system.

FIG. 4 is a flowchart of the battery monitoring system which detects a disconnection state of the voltage detection line. With reference to FIG. 3 and FIG. 4, detection of the disconnection state of the voltage detection line 330 will be explained. In step 801, the switch element 112 and the switch element 113 are turned OFF. Next, in step 802, V1_b2 and V2_b2 being V1 voltage and V2 voltage with the switch element 112 and the switch element 113 turned OFF are measured just before time t4 shown in FIG. 3.

In step 803, the measured voltage V1_b2 is substituted for the just-before voltage on the low potential side of Equation (3) and a varying threshold on the low potential side is calculated. Further, the measured voltage V2_b2 is substituted for the just-before voltage on the high potential side of Equation (2) and a varying threshold on the high potential side is calculated.

Next, in step 804, at time t4 shown in FIG. 3, the switch element 112 is turned ON and the switch element 113 is turned OFF. In step 805, the process is made to wait for a predetermined time. This waiting time is shorter than the time required for detection using a conventional fixed threshold and is determined by a time constant of the filter capacitor 415 for measurement. Next, before time t5, in step 806, V1_d2 and V2_d2 being V1 voltage and V2 voltage are measured.

In step 807, the measured voltage V1_d2 and voltage V2_d2 are each compared with the varying threshold on the low potential side and the varying threshold on the high potential side calculated in step 803. If voltage V1_d2 is smaller than the varying threshold on the low potential side or if voltage V2_d2 is larger than the varying threshold on the high potential side, it is determined that the line is in a disconnected state, and the process advances to step 808. In step 808, the disconnection counter is incremented. When the disconnection counter reaches a fixed level or more, the battery monitoring system 400 confirms a disconnected state. In step 807, if the voltage V1_d2 is not smaller than the varying threshold on the low potential side and the voltage V2_d2 is not larger than the varying threshold on the high potential side, it is determined that there is no disconnection and step 808 is skipped. In step 809, at time t5 shown in FIG. 3, the switch element 112 is turned OFF.

The above process shows an example where the disconnection state is detected by turning the switch element 112 ON. In the following process, however, the disconnection state is detected by turning the switch element 113 ON. Hereafter, this example will be explained with reference to a flowchart shown in FIG. 4.

First, in step 810, the switch element 112 and the switch element 113 are turned OFF. Next, in step 811, V1_b3 and V2_b3 being V1 voltage and V2 voltage with the switch element 112 and the switch element 113 turned OFF are measured just before time t7 shown in FIG. 3.

In step 812, the measured voltage V2_d3 is substituted for the just-before voltage on the low potential side of Equation (3) and a varying threshold on the low potential side is calculated. Further, the measured voltage V1_b3 is substituted for the just-before voltage on the high potential side of Equation (2) and a varying threshold on the high potential side is calculated.

Next, in step 813, at time t7 shown in FIG. 3, the switch element 112 is turned OFF and the switch element 113 is turned ON. In step 814, the process is made to wait for a predetermined time. This waiting time is shorter than the time required for the detection using a conventional fixed threshold. Next, before time t8, in step 815, V1_d3 and V2_d3 being V1 voltage and V2 voltage are measured.

In step 816, the measured voltages V1_d3 and V2_d3 are each compared with the varying threshold on the low potential side and the varying threshold on the high potential side calculated in step 812. If the voltage V1_d3 is larger than the varying threshold on the high potential side, or if the voltage V2_d3 is smaller than the varying threshold on the low potential side, it is determined that the line is in a disconnected state, and the process advances to step 817. In step 817, the disconnection counter is incremented. When the disconnection counter reaches a fixed level or more, the battery monitoring system confirms a disconnected state. In step 816, if the voltage V1_d3 is not smaller than the varying threshold on the low potential side and the voltage V2_d3 is not larger than the varying threshold on the high potential side, it is determined that there is no disconnection and step 817 is skipped. In step 818, at time t8 shown in FIG. 3, the switch element 113 is turned OFF.

With the process described above, the disconnection state of the voltage detection line 330 can be detected. Thus, the disconnection state may be detected with the switch element 113 turned ON. Alternatively, the disconnection state may be detected with the switch element 112 turned ON. Also, as shown in the flowchart of FIG. 4, the disconnection state is detected by turning the switch element 112 ON and, subsequently, the disconnection state may be detected by turning the switch element 113 ON. In this case, the disconnection state can be detected reliably.

In the above description, the detection of the disconnection state of the voltage detection line 330 has been explained. However, detection of disconnection states of the voltage detection lines 320 and 340 can be performed in the same way. Further, disconnection states of voltage detection lines 310 and 350 can be detected by turning the switch element 111 or the switch element 114 ON.

According to the embodiment explained above, the following operational effects can be obtained.

(1) The battery monitoring system 400 includes: the monitoring circuit 100 which is provided corresponding to the assembled battery 200 having a plurality of battery cells 210, 220, 230, and 240, and which monitors states of the battery cells 210, 220, 230, and 240; the voltage detection lines 310, 320, 330, 340, and 350 which are provided corresponding to the battery cells 210, 220, 230, and 240 and which connect the battery cells 210, 220, 230, and 240 with the monitoring circuit 100; and the switch elements 111, 112, 113, and 114 which are provided between the voltage detection lines 310, 320, 330, 340, and 350 and which adjust voltages of the battery cells 210, 220, 230, and 240. The battery monitoring system 400 further compares battery voltages of the adjacent battery cells 210, 220, 230, and 240 with a varying threshold determined based on a voltage just before checking a disconnection state and detects disconnection states of the voltage detection lines 310, 320, 330, 340, and 350 according to the comparison result. Thus, even when the battery voltage is high, the time required for ON control of the switch elements becomes short, and the disconnection state can be detected reliably.

(2) The battery monitoring system 400 also includes filter capacitors 415 and 416 for measurement connected between the voltage detection lines 310, 320, 330, 340, and 350, and compares the battery voltages brought about by charge and discharge of the filter capacitors 415 and 416 for measurement with the varying threshold by allowing the switch elements 111, 112, 113, and 114 to be conducted. Thus, the time required for ON control of the switch elements becomes short, and the disconnection state can be detected reliably.

(3) In the battery monitoring system 400, the varying threshold includes a varying threshold on the high potential side and a varying threshold on the low potential side. The varying threshold on the high potential side is defined by Equation (1) below which is based on a just-before voltage the high potential side being a voltage on the high potential side just before checking a disconnection state and a coefficient α (0<α<1). Further, the varying threshold on the low potential side is defined by Equation (2) below which is based on the just-before voltage on the low potential side being a voltage on the low potential side just before checking a disconnection state and the coefficient α.

$$\text{Varying threshold on high potential side} = \text{just-before voltage on high potential side} \times (1+\alpha) \quad (1)$$

$$\text{Varying threshold on low potential side} = \text{just-before voltage on low potential side} \times (1-\alpha) \quad (2)$$

Accordingly, as compared with the conventional fixed threshold, a disconnection state can be detected in a shorter time.

(4) In the battery monitoring system 400, in a relationship of an upper limit voltage in an input range being the upper limit voltage that the monitoring circuit 100 can measure and A being 0 or more and 1 or less, the coefficient α is a value which satisfies at least one of the following Equation (3) or Equation (4).

$$(\text{Maximum value of battery voltage to be used}) \times 2 \times A \leq (\text{upper limit voltage in input range}) \quad (3)$$

$$(\text{Maximum value of battery voltage to be used}) \times 2 \times (1-A) \times (1+\alpha) \leq \text{upper limit voltage in input range} \quad (4)$$

Accordingly, the varying threshold on the high potential side and the varying threshold on the low potential side can be set suitably.

The present invention is not limited to the embodiments described above and it is to be understood that, in light of the above teachings, any other modifications can be made without deviating from the spirit of the present invention.

LIST OF REFERENCE SIGNS

100: monitoring circuit
110: discharge circuit
111: switch element
112: switch element
113: switch element
114: switch element
120: voltage measurement circuit
130: differential amplifier
140: AD converter
150: communication circuit
200: assembled battery
210: battery cell
220: battery cell
230: battery cell

240: battery cell
300: connection harness
310: voltage detection line
320: voltage detection line
330: voltage detection line
340: voltage detection line
350: voltage detection line
400: battery monitoring system
410: filter circuit for measurement
411: filter resistor for measurement
412: filter resistor for measurement
413: filter resistor for measurement
414: filter resistor for measurement
415: filter capacitor for measurement
416: filter capacitor for measurement
420: adjusting circuit
421: adjusting resistor
422: adjusting resistor
423: adjusting resistor
424: adjusting resistor
500: microcomputer

The invention claimed is:

1. A battery monitoring system, comprising:
a monitoring circuit which is provided corresponding to an assembled battery having a plurality of battery cells and which monitors states of the plurality of battery cells;
voltage detection lines which are provided corresponding to the plurality of battery cells and which connect the plurality of battery cells with the monitoring circuit; and
switch elements which are provided between the voltage detection lines and which adjust voltages of the plurality of battery cells,
wherein the battery monitoring system compares voltages of adjacent battery cells with a varying threshold determined based on a voltage just before checking a disconnection state and detects disconnection states of the voltage detection lines according to a comparison result,
wherein the varying threshold includes a varying threshold on a high potential side and a varying threshold on a low potential side, and
wherein the varying threshold on the high potential side is defined by Equation (1) which is based on a just-before voltage on the high potential side being a voltage on the high potential side just before checking the disconnection state and a coefficient $\alpha$ ($0<\alpha<1$), and the varying threshold on the low potential side is defined by Equation (2) which is based on a just-before voltage on the low potential side being a voltage on the low potential side just-before checking a disconnection state and the coefficient $\alpha$:

$$\text{Varying threshold on high potential side} = \text{just-before voltage on high potential side} \times (1+\alpha) \quad (1)$$

$$\text{Varying threshold on low potential side} = \text{just-before voltage on low potential side} \times (1-\alpha) \quad (2)$$

2. The battery monitoring system according to claim 1, further comprising capacitors connected between the voltage detection lines,
wherein the battery monitoring system compares the voltages obtained by charge and discharge of the capacitors with the varying threshold by allowing the switch elements to be conducted.

3. The battery monitoring system according to claim 1, wherein, in a relationship of an upper limit voltage in an input range being an upper limit voltage which the monitoring circuit can measure and A being 0 or more and 1 or less, the coefficient $\alpha$ is a value which satisfies Equation (3):

$$(\text{Maximum value of the battery voltage to be used}) \times 2 \times (1-A) \times (1+\alpha) \leq (\text{upper limit voltage in input range}) \quad (3)$$

* * * * *